(12) United States Patent
Park et al.

(10) Patent No.: US 9,281,389 B2
(45) Date of Patent: Mar. 8, 2016

(54) SEMICONDUCTOR DEVICE

(71) Applicant: SAMSUNG ELECTRO-MECHANICS CO., LTD., Suwon (KR)

(72) Inventors: Jae Hoon Park, Suwon (KR); In Hyuk Song, Suwon (KR); Dong Soo Seo, Suwon (KR); Kwang Soo Kim, Suwon (KR); Kee Ju Um, Suwon (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 0 days.

(21) Appl. No.: 13/758,917

(22) Filed: Feb. 4, 2013

(65) Prior Publication Data
US 2014/0117373 A1    May 1, 2014

(30) Foreign Application Priority Data

Oct. 26, 2012 (KR) .......................... 10-2012-0119857

(51) Int. Cl.
| | |
|---|---|
| *H01L 29/15* | (2006.01) |
| *H01L 29/778* | (2006.01) |
| *H01L 29/06* | (2006.01) |
| *H01L 29/20* | (2006.01) |

(52) U.S. Cl.
CPC ........ *H01L 29/7787* (2013.01); *H01L 29/0634* (2013.01); *H01L 29/2003* (2013.01)

(58) Field of Classification Search
CPC . H01L 29/15; H01L 31/0256; H01L 21/8232; H01L 21/823418; H01L 21/823437; H01L 29/66431; H01L 29/66462; H01L 29/7782; H01L 2924/13064; H01L 29/7787
USPC .................................... 257/76, 287, E51.005
See application file for complete search history.

(56) References Cited

U.S. PATENT DOCUMENTS

| | | | | |
|---|---|---|---|---|
| 2003/0190789 | A1* | 10/2003 | Salama et al. ................ | 438/286 |
| 2005/0110042 | A1* | 5/2005 | Saito et al. .................... | 257/192 |
| 2006/0049426 | A1* | 3/2006 | Lee et al. ....................... | 257/194 |
| 2008/0116486 | A1* | 5/2008 | Saito et al. .................... | 257/192 |
| 2009/0072240 | A1* | 3/2009 | Suh et al. ........................ | 257/76 |
| 2010/0032683 | A1* | 2/2010 | Ikeda et al. ..................... | 257/76 |
| 2010/0224908 | A1* | 9/2010 | Nakazawa et al. ............ | 257/140 |
| 2013/0240951 | A1* | 9/2013 | Bedell et al. .................. | 257/194 |

OTHER PUBLICATIONS

Dictionary.com.*

* cited by examiner

*Primary Examiner* — Matthew Landau
*Assistant Examiner* — Eric Ashbahian
(74) *Attorney, Agent, or Firm* — Ladas & Parry, LLP

(57) ABSTRACT

Disclosed herein is a semiconductor device including: a source electrode formed on one side of an N-type AlGaN layer; N-type and P-type AlGaN layers formed on the other side of the P-type AlGaN layer and formed in a direction perpendicular to the source electrode; a gate electrode formed on one side of the N-type and P-type AlGaN layers; and a drain electrode formed on the other side of the N-type and P-type AlGaN layers.

19 Claims, 2 Drawing Sheets

SEMICONDUCTOR DEVICE

CROSS REFERENCE TO RELATED APPLICATION

This application claims the benefit of Korean Patent Application No. 10-2012-0119857, filed on Oct. 26, 2012, entitled "Semiconductor Device", which is hereby incorporated by reference in its entirety into this application.

BACKGROUND OF THE INVENTION

1. Technical Field

The present invention relates to a semiconductor device.

2. Description of the Related Art

Various nitride semiconductor devices including the semiconductor device disclosed in Patent Document 1 have a number of advantages such as high breakdown electric field, high electron mobility, high temperature operation, high thermal conductivity, and the like, to be widely used in a high voltage device, a high frequency device, or the like.

Among these devices, a field effect transistor (hereinafter, referred to as FET) device has a limitation in a spaced distance between a source terminal and a drain terminal for securing breakdown capability.

If the spaced distance between the source terminal and the drain terminal is large, at the time of turning-on the FET device, turn-on resistance is large due to an increase in the spaced distance between the source terminal and the drain terminal.

In other words, there is a trade-off relation between the breakdown capacity and the turn-on resistance.

Meanwhile, the semiconductor device is required to secure the spaced distance having a predetermined distance or larger for securing breakdown voltage between the source terminal and the drain terminal, and the longer the spaced distance, the larger the resistance between the source terminal and the drain terminal.

Therefore, in order to decrease the resistance between the source terminal and the drain terminal, the spaced distance therebetween is required to be decreased; however, in this case, it is difficult to secure the breakdown voltage.

PRIOR ART DOCUMENT

Patent Document

Patent Document 1 US 2006-0049426 A

SUMMARY OF THE INVENTION

The present invention has been made in an effort to provide a semiconductor device having a structure in which a gate terminal and a drain terminal are improved to increase operational reliability of the semiconductor device.

According to a preferred embodiment of the present invention, there is provided a semiconductor device including: an undoped Group III-V first semiconductor layer; a first conductive Group III-V second semiconductor layer formed on the undoped Group III-V first semiconductor layer; a first electrode formed on one side of the first conductive Group III-V second semiconductor layer; first and second conductive Group III-V second semiconductor layers formed on the other side of the first conductive Group III-V second semiconductor layer and formed in a direction perpendicular to the first electrode; a second electrode formed on one side of the first and second conductive Group III-V second semiconductor layers; and a third electrode formed on the other side of the first and second conductive Group III-V second semiconductor layers, wherein the first conductive Group III-V second semiconductor layer and the second conductive Group III-V second semiconductor layer are alternately formed.

The number of first conductive Group III-V second semiconductor layer and the number of second conductive Group III-V second semiconductor layer may be in plural, respectively.

A width of the first conductive Group III-V second semiconductor layer and a width of the second conductive Group III-V second semiconductor layer in a direction of the first electrode may be the same.

The first conductive Group III-V second semiconductor layer and the second conductive III-V second semiconductor layer may have the same concentration.

The undoped Group III-V first semiconductor layer may be made of GaN material.

The Group III-V second semiconductor layer may be made of an AlGaN material.

The first conductive Group III-V second semiconductor layer may be N-type, and the second conductive Group III-V second semiconductor layer may be P-type.

The first electrode may be a source electrode, a second electrode may be a gate electrode, and a third electrode may be a drain electrode.

The second electrode and the third electrode may be formed in a horizontal direction of the first electrode, respectively.

According to another preferred embodiment of the present invention, there is provided a semiconductor device including: an undoped GaN layer; a first conductive AlGaN layer formed on the undoped GaN layer; a source electrode formed on one side of the first conductive AlGaN layer; first and second conductive AlGaN layers formed on the other side of the first conductive AlGaN layer and formed in a direction perpendicular to the source electrode; a gate electrode formed on one side of the first and second conductive AlGaN layers; and a drain electrode formed on the other side of the first and second conductive AlGaN layers, wherein the first conductive AlGaN layer and the second conductive AlGaN layer are alternately formed.

The number of first conductive AlGaN layer and the number of second conductive AlGaN layer may be in plural, respectively.

A width of the first conductive AlGaN layer and a width of the second conductive AlGaN layer in a direction of the source electrode may be the same.

The first conductive AlGaN layer and the second conductive AlGaN layer may have the same concentration.

The first conductive AlGaN layer may be N-type, and the second conductive AlGaN layer may be P-type.

The gate electrode and the drain electrode may be formed in a horizontal direction of the source electrode, respectively.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
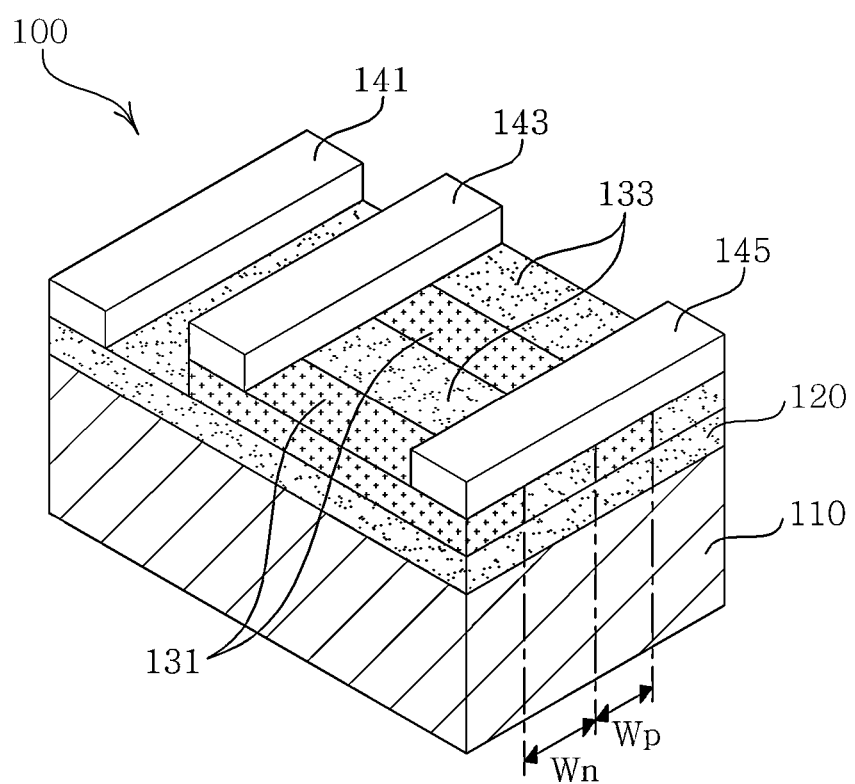
FIG. 1 is a view showing a configuration of a semiconductor device according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

The semiconductor device disclosed in the description of the preferred embodiments may be a field effect transistor, but the present invention is not limited thereto.

Semiconductor Device

FIG. 1 is a view showing a configuration of a semiconductor device according to a preferred embodiment of the present invention.

As shown in FIG. 1, the semiconductor device 100 may include: an undoped Group III-V first semiconductor layer 110; a first conductive Group III-V second semiconductor layer 120 formed on the undoped Group III-V first semiconductor layer 110; a first electrode 141 formed on one side of the first conductive Group III-V second semiconductor layer 120; first and second conductive Group III-V second semiconductor layers 133 and 131 formed on the other side of the first conductive Group III-V second semiconductor layer 120 and formed in a direction perpendicular to the first electrode 141; a second electrode 143 formed on one side of the first and second conductive Group III-V second semiconductor layers 133 and 131; and a third electrode 145 formed on the other side of the first and second conductive Group III-V second semiconductor layers 133 and 131.

Here, the first conductive Group III-V second semiconductor layer 133 and the second conductive Group III-V second semiconductor layer 131 may be alternately formed.

In addition, as shown in FIG. 1, the number of first conductive Group III-V second semiconductor layer 133 and the number of second conductive Group III-V second semiconductor layer 131 may be in plural, respectively.

In this case, as shown in FIG. 1, the first conductive Group III-V second semiconductor layer 133 and the second conductive Group III-V second semiconductor layer 131 may be sequentially and alternately formed, respectively. For example, the semiconductor device 100 has a structure obtained by forming the second conductive Group III-V second semiconductor layer 131, then forming the first conductive Group III-V second semiconductor layer 133 so as to be contacted to the second conductive Group III-V second semiconductor layer, and repeating these formations.

Meanwhile, the above-described Group III-V first semiconductor layer may be made of a GaN material.

In addition, the Group III-V second semiconductor layer may be made of an AlGaN material.

Further, the first conductive semiconductor layer may be an N-type, and the second conductive semiconductor layer may be a P-type.

In addition, the first electrode 141 may be a source electrode, the second electrode 143 may be a gate electrode, and the third electrode 145 may be a drain electrode.

In addition, as shown in FIG. 1, a width (Wn) of the first conductive Group III-V second semiconductor layer 133 and a width (Wp) of the second conductive Group III-V second semiconductor layer 131 in a direction of the first electrode 141 may be the same. For example, the width (Wn) of the first conductive Group III-V second semiconductor layer 133 and the width (Wp) of the second conductive Group III-V second semiconductor layer 131 shown in FIG. 1 are the same.

Here, the term 'same' does not mean thickness of dimensions that are accurately the same in mathematics, but means the thickness of dimensions that are substantially the same in consideration of errors in design, in manufacture, in measurement, or the like.

In addition, the first conductive Group III-V second semiconductor layer 133 and the second conductive Group III-V second semiconductor layer 131 have the same concentration.

That is, at the time of reverse bias, since a stripe structure (alternate structure) of the first conductive Group III-V second semiconductor layer 133 and the second conductive Group III-V second semiconductor layer 131 should be all depleted, the first conductive Group III-V second semiconductor layer 133 and the second conductive Group III-V second semiconductor layer 131 should have the same width (Wn=Wp in FIG. 1) and should also have the same concentration.

As shown in FIG. 1, the second electrode 143 and the third electrode 145 may be formed in a horizontal direction of the first electrode 141, respectively.

That is, the first electrode 141, the second electrode 143, and the third electrode 145 are disposed at different heights, but are formed in a horizontal direction.

Figure 2:
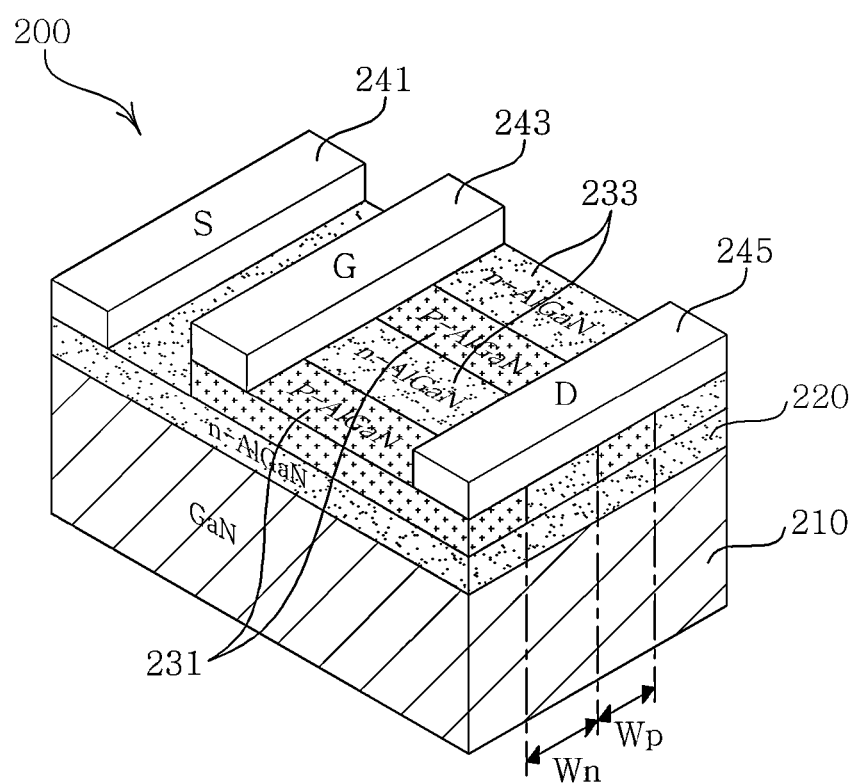
FIG. 2 is a view for illustrating a specific example of the semiconductor device of FIG. 1.

FIG. 2 is a view for illustrating a specific example of the semiconductor device of FIG. 1.

As shown in FIG. 2, the semiconductor device 200 may include: an undoped GaN layer 210; a first conductive AlGaN layer 220 formed on the undoped GaN layer 210; a source electrode 241 formed on one side of the first conductive AlGaN layer 220; first and second conductive AlGaN layers 233 and 231 formed on the other side of the first conductive AlGaN layer 220 and formed in a direction perpendicular to the source electrode 241; a gate electrode 243 formed on one side of the first and second conductive AlGaN layers 233 and 231; and a drain electrode 245 formed on the other side of the first and second conductive AlGaN layers 233 and 231.

Here, the first conductive AlGaN layer may be N-type, and the second conductive AlGaN layer may be P-type.

As a thickness of the first conductive (N-type) AlGaN layer 220 is thin, 2 Dimensional Electron Gas (2DEG) is decreased on an interface between the undoped AlGaN layer 210 and the first conductive (N-type) AlGaN layer 220, and as a thickness thereof is large, a large amount of electron carrier may be secured on the interface between the undoped AlGaN layer 210 and the first conductive (N-type) AlGaN layer 220. Therefore, the thickness of the first conductive (N-type) AlGaN layer 220 may be determined in consideration of the above-description.

As shown in FIG. 2, the gate electrode 243 and the drain electrode 245 may be formed in a horizontal direction of the source electrode 241, respectively.

That is, the source electrode 241, the gate electrode 243, and the drain electrode 245 are disposed at different heights, but are formed in a horizontal direction.

In addition, the first conductive AlGaN layer 233 and the second conductive AlGaN layer 231 may be alternately formed.

In addition, as shown in FIG. 2, the number of first conductive AlGaN layer 233 and the number of second conductive AlGaN layer 231 may be in plural, respectively.

In this case, as shown in FIG. 2, the first conductive AlGaN layer 233 and the second conductive AlGaN layer 231 may be sequentially and alternately formed, respectively. For example, the semiconductor device 200 has a structure obtained by forming the second conductive AlGaN layer 231, then forming the first conductive AlGaN layer 233 so as to be contacted to the second conductive AlGaN layer 231, and repeating these formations.

In addition, as shown in FIG. 2, a width of the first conductive AlGaN layer 233 and a width of the second conductive AlGaN layer 231 in a direction of the source electrode 241 may be the same.

For example, the width (Wn) of the first conductive AlGaN layer 233 and the width (Wp) of the second conductive AlGaN layer 231 shown in FIG. 2 are the same.

Here, the term 'same' does not mean thickness of dimensions that are accurately the same in to mathematics, but means the thickness of dimensions that are substantially the same in consideration of errors in design, in manufacture, in measurement, or the like.

In addition, the first conductive AlGaN layer 233 and the second conductive AlGaN layer 231 may have the same concentration.

That is, at the time of reverse bias, since a stripe structure (alternate structure) of the first conductive AlGaN layer 233 and the second conductive AlGaN layer 231 should be all depleted, the first conductive AlGaN layer 233 and the second conductive AlGaN layer 231 should have the same width (Wn=Wp in FIG. 2) and should also have the same concentration.

A general AlGaN/GaN field effect transistor (hereinafter, referred to as FET) has a structure in which there are a source terminal and a drain terminal forming an ohmic contact with an AlGaN layer and a gate contact is formed on the AlGaN layer to form a Schottky contact.

Accordingly, an operation of the FET is performed by controlling the voltage of the gate terminal to connect or disconnect 2DEG between the source terminal and the drain terminal.

In the above-described case, the source terminal and the drain terminal need to be spaced apart at a predetermined distance or larger for securing breakdown voltage, and the reason is that the longer the spaced distance, the larger the resistance between the source terminal and the drain terminal. Meanwhile, in order to decrease the resistance between the source terminal and the drain terminal, the spaced distance therebetween is required to be decreased; however, in this case, it is difficult to secure the breakdown voltage.

In the preferred embodiment of the present invention, the P-type AlGaN layers and the N-type AlGaN layers are alternately formed (hereinafter, referred to as a P/N AlGaN stripe structure), and the gate electrode and the drain electrode forming an ohmic contact with the gate electrode may be formed on the stripe structure.

In the above-described structure, the gate electrode may form a Schottky contact with P-type AlGaN layer and N-type AlGaN layer, to thereby be still operated as a gate.

In addition, since the semiconductor device of the present invention is formed so that the P/N type AlGaN stripe structure has the same concentration as each other, at the time of applying high voltage to the drain electrode, the entire area of the P/N AlGaN stripe structure is depleted to be converted into a pseudo intrinsic AlGaN state. Therefore, when considering that as concentration of a substrate decreases, breakdown capacity generally increases, even though the spaced distance between the gate electrode and the drain electrode is short, the structure of the semiconductor device of the present invention may secure high breakdown voltage.

In addition, in the semiconductor device of the present invention, as the spaced distance between the gate electrode and the drain electrode is short, the spaced distance between the source electrode and the drain electrode is also decreased to lower a turn-on voltage.

That is, at the time of operating the semiconductor device of the present invention in an electrical conduction, the spaced distance between the source electrode and the drain electrode is relatively short as compared to the case of the prior art, such that the turn-on voltage may be lowered.

At the time of operating the semiconductor device in a blocking mode, the P/N AlGaN stripe structure disposed between the gate electrode and the drain electrode is entirely depleted to be converted into the intrinsic AlGaN state, such that the same breakdown voltage as the case of the prior art may be achieved even though the spaced distance between the drain electrode and the source electrode is relatively short.

As set forth above, with the semiconductor device according to the preferred embodiment of the present invention, the P-type Group III-V semiconductor layer and the N-type Group III-V semiconductor layer are alternately formed on the Group III-V semiconductor layer such as AlGaN, to and the gate electrode and the drain electrode forming the ohmic contact with the gate electrode are then formed on the P-type and N-type Group III-V semiconductor layers, thereby making it possible to secure the high breakdown voltage at the time of operating the semiconductor device.

In addition, with the semiconductor device according to the preferred embodiment of the present invention, the spaced distance between the source electrode and the drain electrode shorter than that of the prior art is secured at the same breakdown voltage level to thereby lower the turn-on voltage of the semiconductor device, thereby making it possible to implement the semiconductor device having a size smaller than that of the prior art.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A semiconductor device comprising:
    an undoped Group III-V first semiconductor layer;
    a layer of first conductive Group III-V second semiconductor formed on the undoped Group III-V first semiconductor layer;
    a first electrode formed on one side of the layer of first conductive Group III-V second semiconductor;
    a layer of first and second conductive Group III-V second semiconductor formed on another side of the layer of the first conductive Group III-V second semiconductor and formed in a direction perpendicular to the first electrode;
    a second electrode formed directly on one side of the layer of first and second conductive Group III-V second semiconductor; and a third electrode formed directly on another side of the layer of first and second conductive Group III-V second semiconductor, wherein the layer of first and second conductive Group III-V second semiconductor includes alternating bands of first conductive Group III-V second semiconductor and second conductive Group II-V second semiconductor.

2. The semiconductor device as set forth in claim 1, wherein the layer of first and second conductive Group III-V second semiconductor includes a plurality of bands of each of first conductive Group III-V second semiconductor and second conductive Group III-V second semiconductor.

3. The semiconductor device as set forth in claim 1, wherein a width of the band(s) of first conductive Group III-V second semiconductor and a width of the band(s) of second conductive Group III-V second semiconductor in a direction of the first electrode are the same.

4. The semiconductor device as set forth in claim 1, wherein the band(s) of first conductive Group III-V second semiconductor and the band(s) of second conductive Group III-V second semiconductor have the same concentration.

5. The semiconductor device as set forth in claim 1, wherein the undoped Group III-V first semiconductor layer is made of GaN material.

6. The semiconductor device as set forth in claim 1, wherein the bands of first and second conductive Group III-V second semiconductor and the layer of first conductive Group III-V second semiconductor are made of an AlGaN material.

7. The semiconductor device as set forth in claim 1, wherein the band(s) of first conductive Group III-V second semiconductor and the layer of first conductive Group III-V second semiconductor are N-type, and the band(s) of second conductive Group III-V second semiconductor layer are P-type.

8. The semiconductor device as set forth in claim 1, wherein the first electrode is a source electrode, a second electrode is a gate electrode, and a third electrode is a drain electrode.

9. The semiconductor device as set forth in claim 1, wherein the second electrode and the third electrode are located in a horizontal direction from the first electrode.

10. A semiconductor device comprising:
an undoped GaN layer;
a layer of first conductive AlGaN layer formed on the undoped GaN layer;
a source electrode formed directly on one side of the layer of first conductive AlGaN;
a layer of first and second conductive AlGaN formed on another side of the layer of first conductive AlGaN and formed in a direction perpendicular to the source electrode;
a gate electrode formed directly on one side of the layer of first and second conductive AlGaN; and
a drain electrode formed directly on another side of the layer of first and second conductive AlGaN,
wherein the layer of first and second conductive AlGaN includes alternating bands of first conductive AlGaN and second conductive AlGaN.

11. The semiconductor device as set forth in claim 10, wherein the layer of first and second AlGaN includes a plurality of bands of first conductive AlGaN and second conductive AlGaN.

12. The semiconductor device as set forth in claim 10, wherein a width of the band(s) of first conductive AlGaN and a width of band(s) of second conductive AlGaN in a direction of the source electrode are the same.

13. The semiconductor device as set forth in claim 10, wherein the band(s) of first conductive AlGaN and the band(s) of second conductive AlGaN have the same concentration.

14. The semiconductor device as set forth in claim 10, wherein the band(s) of first conductive AlGaN and the layer of first conductive AlGaN are N-type, and the band(s) of second conductive AlGaN layer are P-type.

15. The semiconductor device as set forth in claim 10, wherein the gate electrode and the drain electrode are located in a horizontal direction from the source electrode.

16. The semiconductor device as set forth in claim 1, wherein the layer of first and second conductive Group III-V second semiconductor is formed directly on the other side of the layer of first conductive Group III-V second semiconductor.

17. The semiconductor device as set forth in claim 10, wherein the layer of first and second conductive AlGaN is formed directly on the other side of the layer of first conductive AlGaN.

18. The semiconductor device of claim 1, wherein the layer of first conductive Group III-V second semiconductor is located between the undoped Group III-V layer and the layer of first and second conductive Group III-V second semiconductor.

19. The semiconductor device of claim 10, wherein the layer of first conductive AlGaN is located between the undoped GaN layer and the layer of first and second conductive AlGaN.

* * * * *